United States Patent
Leobandung

(10) Patent No.: US 10,043,863 B2
(45) Date of Patent: Aug. 7, 2018

(54) GRATED MIM CAPACITOR TO IMPROVE CAPACITANCE

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/400,351

(22) Filed: Jan. 6, 2017

(65) Prior Publication Data

US 2018/0197946 A1    Jul. 12, 2018

(51) Int. Cl.
*H01L 29/00*   (2006.01)
*H01L 49/02*   (2006.01)
*H01L 23/522*  (2006.01)

(52) U.S. Cl.
CPC .......... *H01L 28/92* (2013.01); *H01L 23/5223* (2013.01); *H01L 28/75* (2013.01)

(58) Field of Classification Search
CPC . H01L 51/56; H01L 51/0072; H01L 51/5206; H01L 51/5253; C09K 11/06
USPC .......................................................... 257/534
See application file for complete search history.

(56) References Cited

U.S. PATENT DOCUMENTS

| 2014/0159200 | A1* | 6/2014 | Loke | H01L 23/5223 257/532 |
| 2015/0294936 | A1* | 10/2015 | Shen | H01L 23/5223 257/532 |
| 2017/0309563 | A1* | 10/2017 | Zang | H01L 23/5223 |

* cited by examiner

*Primary Examiner* — Andy Huynh
(74) *Attorney, Agent, or Firm* — Scully, Scott, Murphy & Presser, P.C.; Louis J. Percello, Esq.

(57) ABSTRACT

An on-chip metal-insulator-metal (MIM) capacitor with enhanced capacitance is provided by forming the MIM capacitor along sidewall surfaces and a bottom surface of each trench of a plurality of trenches formed in a back-end-of-the-line (BEOL) metallization stack to increase a surface area of the MIM capacitor.

10 Claims, 13 Drawing Sheets

GRATED MIM CAPACITOR TO IMPROVE CAPACITANCE

BACKGROUND

The present application relates to semiconductor device fabrication, and more particularly to the fabrication of a grated metal-insulator-metal (MIM) capacitor structure that has enhanced capacitance.

On-chip capacitors including metal-insulator-metal (MIM) capacitors are essential for many semiconductor chips. For example, MIM capacitors are frequently utilized as decoupling capacitors for mitigating power supply or switching noise caused by changes in current flowing in an integrated chip. MIM capacitors are often integrated into a back-end-of-the-line (BEOL) metallization stack, at a position between an underlying first metallization layer and an overlying second metallization layer. When integrated, a MIM capacitor is commonly formed as a stacked structure including planar electrode plates. Thus, to ensure a minimal capacitance, a large chip area is usually required for a MIM capacitor which, in turn, adversely increases the chip size and thus the cost of the chip. There is thus a need for providing on-chip MIM capacitors that have enhanced capacitance without increasing the size of the chip or the cost of the chip.

SUMMARY

An on-chip MIM capacitor with enhanced capacitance and a method of forming the same are disclosed. In the present application, a MIM capacitor is formed along sidewall surfaces and bottom surfaces of a plurality of trenches located in a BEOL metallization stack to increase the surface area of the MIM capacitor. Thus, the capacitance of the MIM capacitor can be increased without increasing the size of the chip.

In one aspect of the present application, a semiconductor structure is provided. The semiconductor structure includes a first lower interconnect structure embedded in a portion of a first dielectric material layer and a second lower interconnect structure embedded in another portion of the first dielectric material layer. A second dielectric material layer is located over the first dielectric material layer. A metal-insulator-metal (MIM) capacitor is located along sidewall surfaces and a bottom surface of each trench of a plurality of trenches present in an upper portion of the second dielectric material layer and on topmost surfaces of portions of the second dielectric material layer defining the plurality of trenches. A third dielectric material layer is located over the MIM capacitor and the second dielectric material layer. A first upper interconnect structure extends through the third dielectric material layer and the second dielectric material layer to vertically contact the first lower interconnect structure. The first upper interconnect structure laterally contacts a first end of the MIM capacitor. A second upper interconnect structure extends through the third dielectric material layer and the second dielectric material layer to vertically contact the second lower interconnect structure. The second upper interconnect structure laterally contacts a second end of the MIM capacitor opposite the first end.

In another aspect of the present application, a method of forming a semiconductor structure is provided. The method includes first providing a metallization structure including a first dielectric material layer and a first lower interconnect structure embedded in a portion of the first dielectric material layer and a second lower interconnect structure embedded in another portion of the first dielectric material layer. After forming a second dielectric material layer on the metallization structure, a plurality of trenches is formed in an upper portion of the second dielectric material layer. The plurality of trenches extend across the first lower interconnect structure and the second lower interconnect structure. Next, a first metal layer is formed along sidewall surfaces and a bottom surface of each trench of the plurality of trenches and a topmost surface of the second dielectric material layer. The first metal layer is then patterned to remove the first metal layer completely from an area where the second lower interconnect structure is located. The patterning the first metal layer provides a first metal portion overlying the first lower interconnect structure. Next, a first capacitor dielectric layer is formed on the first metal portion and exposed surfaces of the plurality of trenches. After forming a second metal layer over the first capacitor dielectric layer, the second metal layer is patterned to remove the second metal layer completely from an area where the first lower interconnect structure is located. The patterning the second metal layer provides a second metal portion overlying the second lower interconnect structure. A third dielectric material layer is then formed to completely fill the plurality of trenches. Next, a first upper interconnect structure is formed extending through the third dielectric material layer, the first capacitor dielectrics layer, the first metal portion and the second dielectric material layer to contact the first lower interconnect structure and a second upper interconnect structure is formed extending through the third dielectric material layer, the second metal portion, the first capacitor dielectric layer and the second dielectric material layer to contact the second lower interconnect structure.

DETAILED DESCRIPTION

Figure 1:
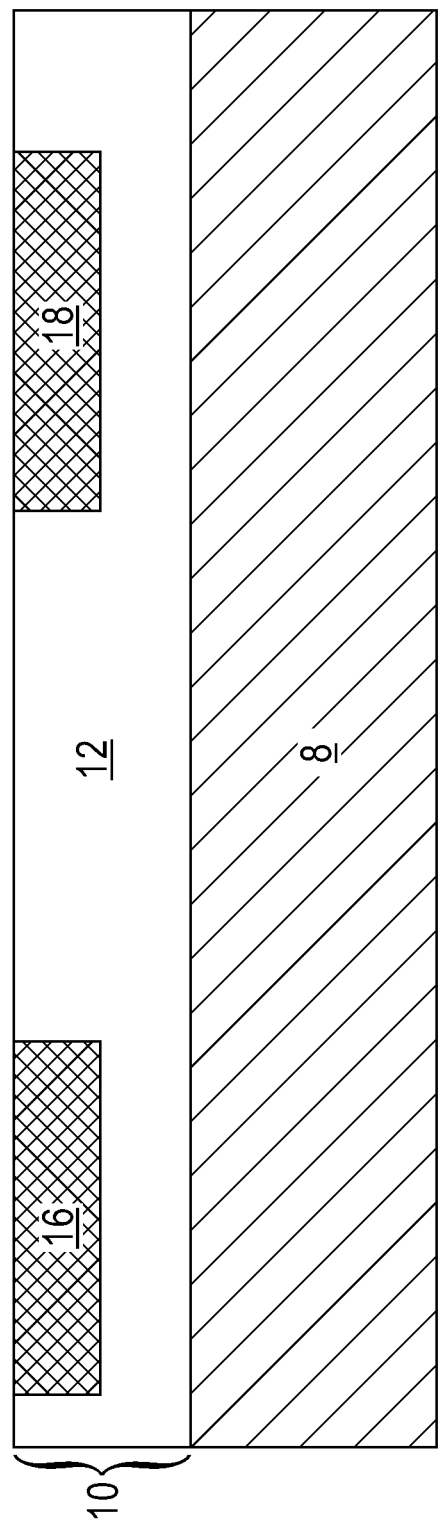
FIG. 1 is a cross sectional view of an exemplary semiconductor structure including from, bottom to top, a semiconductor substrate and a BEOL metallization structure including a first dielectric material layer and a first lower interconnect structure and a second lower interconnect structure embedded therein.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring now to FIG. 1, there is illustrated an exemplary semiconductor structure including from, bottom to top, a substrate 8 and a back-end-of-line (BEOL) metallization structure 10 that can be employed according to an embodiment of the present application. As is shown, the BEOL metallization structure 10 includes a first dielectric material layer 12 constituting an interlevel dielectric of a metallization level ($M_x$) and a first lower interconnect structure 16 and a second lower interconnect structure 18 embedded in the first dielectric material layer 12. The first lower interconnect structure 16 is spaced apart from the second lower interconnect structure 18.

The substrate 8 may be composed of transistors connected by metal wiring on top of a semiconductor material. Such structure is common on semiconductor process. Exemplary semiconductor materials that may be used as substrate 8 include, but are not limited to, Si, SiGe, SiGeC, SiC, Ge, III/V compound semiconductors, II/VI compound semiconductors, and carbon-containing materials such as, for example, carbon nanotubes and graphene. In one embodiment, the semiconductor material which can be employed as substrate 8 may be present in a bulk semiconductor substrate. In another embodiment, the semiconductor material which can be employed as substrate 8 may be a topmost layer of a multilayered semiconductor material stack. In yet another embodiment, the semiconductor material that can be employed as substrate 8 can be a topmost layer of a semiconductor-on-insulator substrate.

In some embodiments, the semiconductor material that can be employed as substrate 8 can be single crystalline (i.e., a material in which the crystal lattice of the entire sample is continuous and unbroken to the edges of the sample, with no grain boundaries). In another embodiment, the semiconductor material that can be employed as substrate 8 can be polycrystalline (i.e., a material that is composed of many crystallites of varying size and orientation; the variation in direction can be random (called random texture) or directed, possibly due to growth and processing conditions). In yet another embodiment of the present application, the semiconductor material that can be employed as substrate 8 can be amorphous (i.e., a non-crystalline material that lacks the long-range order characteristic of a crystal). Typically, the semiconductor material that can be employed as substrate 8 is a single crystalline semiconductor material, such as, for example, single crystalline silicon.

The substrate 8 may be doped, undoped or contain doped and undoped regions therein. For clarity, the doped regions are not specifically shown in substrate 8. Each doped region within the substrate 8 may have the same, or they may have different conductivities and/or doping concentrations.

The substrate 8 may include other active devices such as diodes as well as passive devices such as resistors. One or more metallization levels (not shown) may exist between the metallization level ($M_x$) and the substrate 8 for interconnecting the active and passive devices into integrated circuits.

The first dielectric material layer 12 are usually part of upper metal wiring to connect lower metal wiring and transistors on top of substrate 8. The first dielectric material layer 12 may include a low-k dielectric material. By "low-k" it is meant a dielectric material having a dielectric constant that is about 4.0 or less. In one embodiment, the first dielectric material layer 12 includes a porous dielectric material such as, for example, organosilicates, silsequioxanes, undoped silicate glass (USG), fluorosilicate glass (FSG), SiCOH and borophosphosilicate glass (BPSG). The first dielectric material layer 12 may be formed by chemical vapor deposition (CVD), plasma enhanced chemical vapor deposition (PECVD) or spin coating. The thickness of the first dielectric material layer 12 may be from 100 nm to 1,000 nm, although lesser and greater thicknesses can also be employed.

The first and second lower interconnect structures 16, 18 can be formed by formation of interconnect openings (not shown) in the first dielectric material layer 12 utilizing a combination of lithographic patterning and etching known in the art. For example, a photoresist layer (not shown) can be applied over the first dielectric material layer 12 and lithographically patterned to form a pattern of openings therein. The openings overlie areas in which formation of the interconnect openings are desired. The pattern in the photoresist layer is transferred into the first dielectric material layer 12 by an anisotropic etch to form the interconnect openings. The anisotropic etch can be a dry etch such as reactive ion etch (RIE) or a wet etch. After forming the interconnect openings, the remaining portions of the photoresist layer can be removed, for example, by ashing.

Next, a conductive material is deposited in the interconnect openings to completely fill the interconnect openings. The conductive material may include a conductive metal such as, for example, W, Cu, Al, Co, Ru, Mo, Os, Jr, Rh or an alloy thereof. The conductive material may be deposited by any suitable deposition method such as, for example, CVD, physical vapor deposition (PVD) or plating. After deposition, any deposited materials that are located above a topmost surface of the first dielectric material layer 12 can be removed by a planarization process such as, for example, chemical mechanical planarization (CMP). The topmost surfaces of the first and second lower interconnect structures 16, 18 are thus coplanar with the topmost surface of the first dielectric material layer 12.

Optionally, a diffusion barrier liner (not shown) may be formed on the sidewall surfaces and a bottom surface of each interconnect opening before filling each interconnect opening with the conductive material. Each diffusion barrier liner thus laterally surrounds a lower interconnect structure 16, 18. Each diffusion barrier liner may include Ti, Ta, Ni, Co, Pt, W, TiN, TaN, WN, WC an alloy thereof, or a stack thereof such as Ti/TiN and Ti/WC. The diffusion barrier liners can be formed by any deposition technique including, for example, CVD, PECVD, PVD or atomic layer deposition (ALD). The thickness of the each diffusion liner can be from 1 nm to 5 nm, although lesser and greater thicknesses can also be employed.

Figure 2:
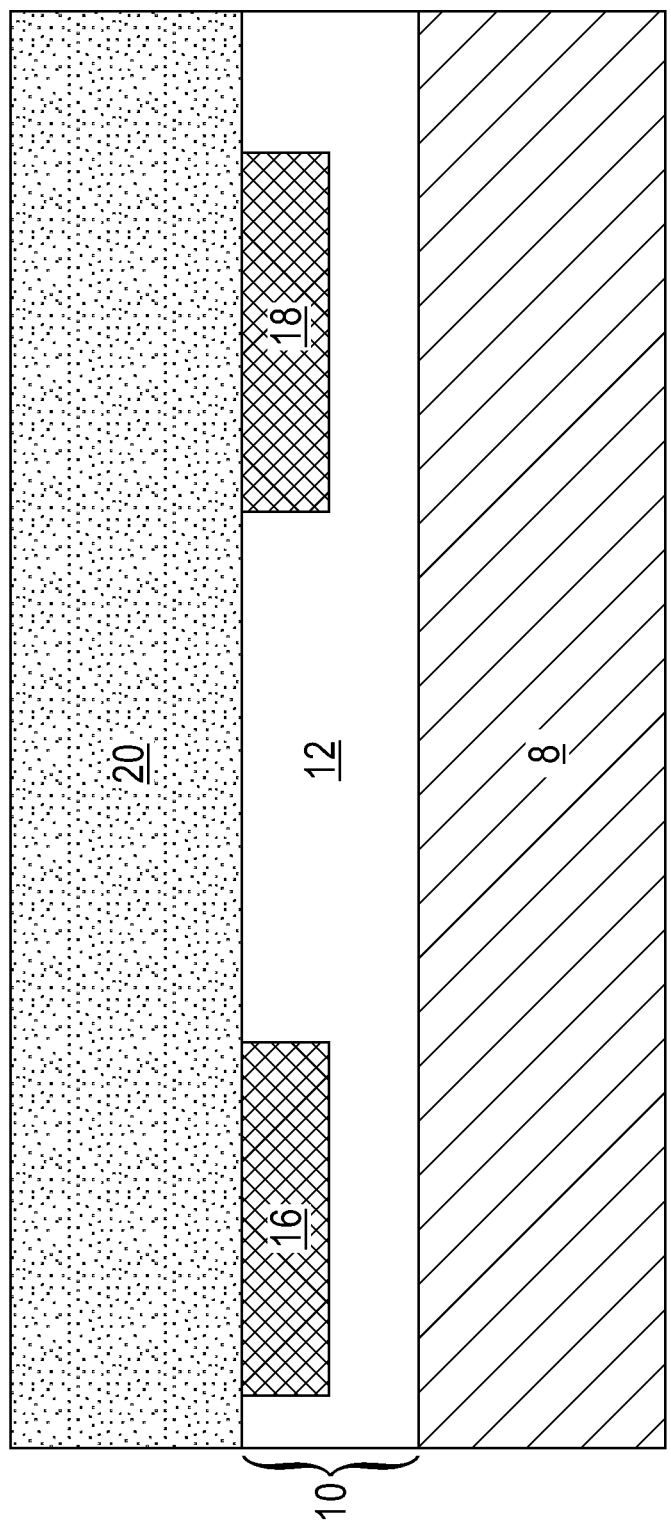
FIG. 2 is a cross sectional view of the exemplary semiconductor structure of FIG. 1 after forming a second dielectric material layer over the BEOL wiring structure.

Referring now to FIG. 2, there is illustrated the exemplary semiconductor structure of FIG. 1 after forming a second dielectric material layer 20 that constitutes an ILD of an upper metallization level ($M_{x+1}$). The second dielectric material layer 20 may include a dielectric material the same as, or different from, the first dielectric material layer 12. For example, the second dielectric material layer 20 may include organosilicates, silsequioxanes, USG, FSG, SiCOH or BPSG. The second dielectric material layer 20 may be formed by CVD, PVD or spin coating. The thickness of the second dielectric material layer 20 may be from 100 nm to 1,000 nm, although lesser and greater thicknesses can also be employed.

Figure 3:
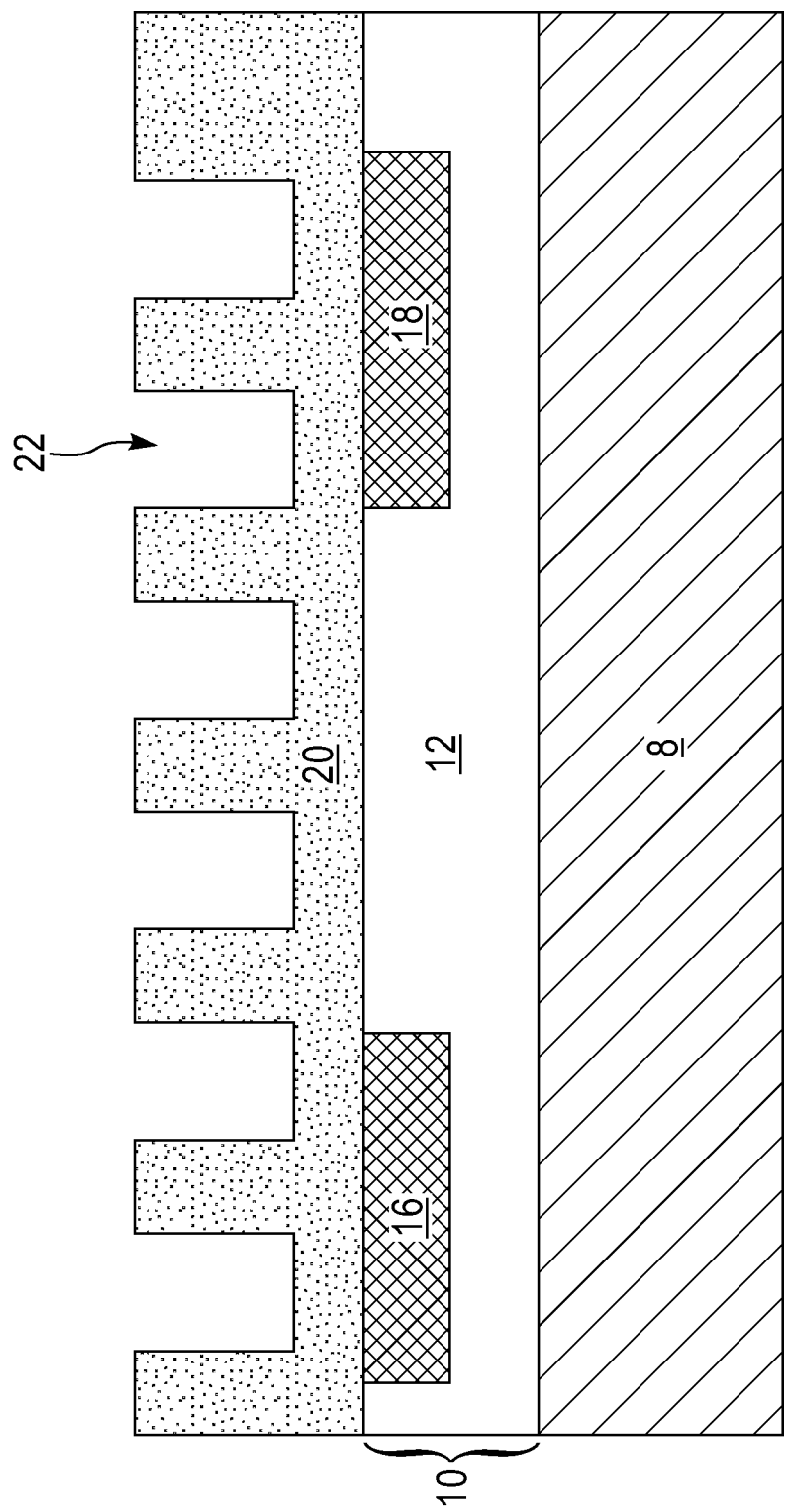
FIG. 3 is a cross sectional view of the exemplary semiconductor structure of FIG. 2 after forming a grating structure which includes a plurality of trenches in an upper portion of the second dielectric material layer.

Referring now to FIG. 3, there is illustrated the exemplary semiconductor structure of FIG. 2 after forming a grating structure which includes a plurality of trenches 22 extending above and between the first and second lower interconnect structures 16, 18 in an upper portion of the second dielectric material layer 20. The grating structure of trenches 22 is adapted to increase surface area of a MIM capacitor to be subsequently formed. The trenches 22 can be formed by applying a photoresist layer over the second dielectric material layer 20, and then lithographically patterning the photoresist layer to form openings therein. The pattern in the photoresist layer is transferred into an upper portion of the second dielectric material layer 20 to form the trenches 22. In one embodiment of the present application, a RIE may be performed to remove exposed portions of the second dielectric material layer 30. After forming the trenches 22, the remaining photoresist layer can be removed, for example, by ashing.

Figure 4:
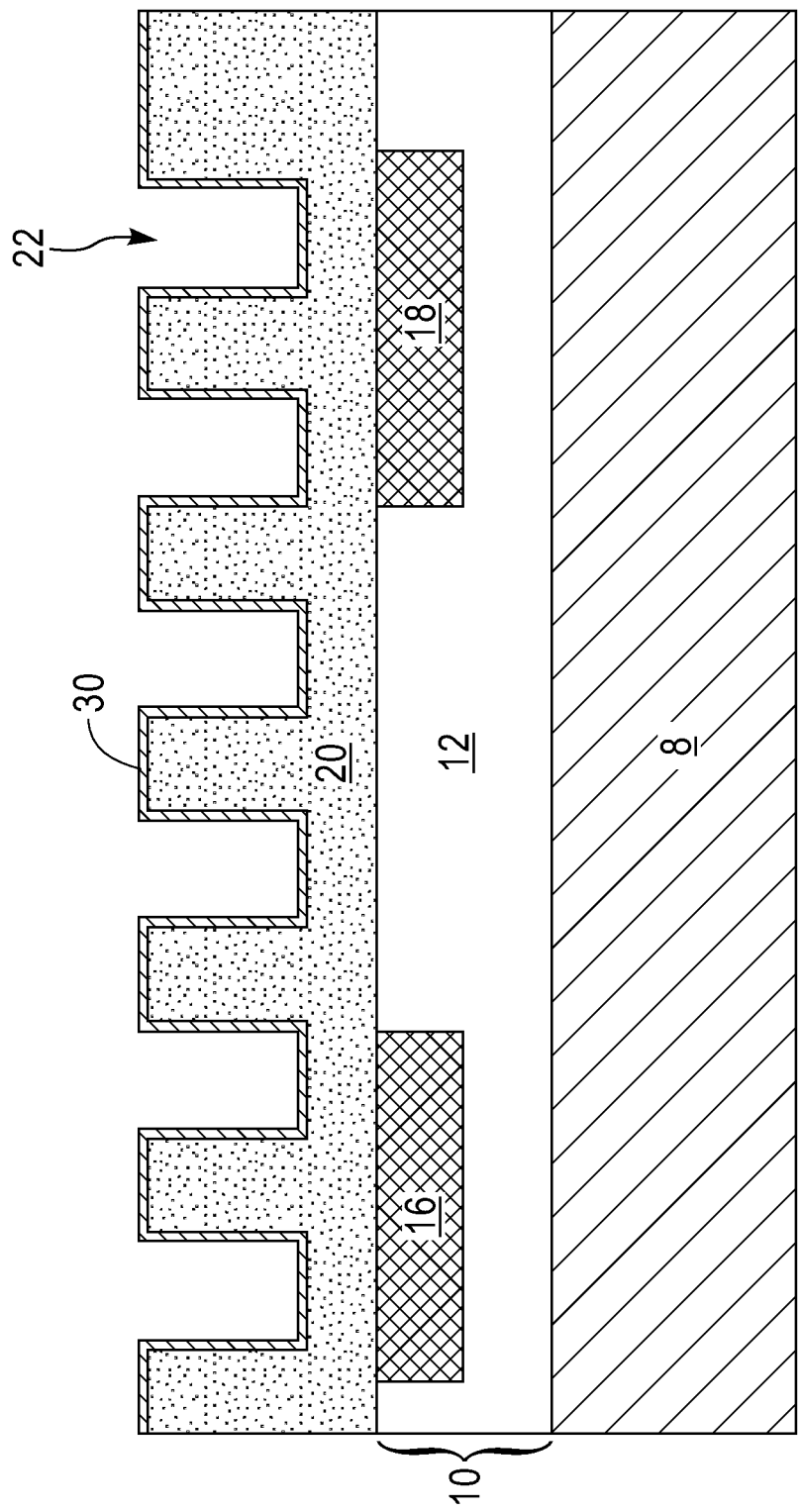
FIG. 4 is a cross sectional view of the exemplary semiconductor structure of FIG. 3 after conformally depositing a first metal layer along sidewall surfaces and a bottom surface of each of the trenches and over a topmost surface of the second dielectric material layer.

Referring now to FIG. 4, there is illustrated the exemplary semiconductor structure of FIG. 3 after conformally depositing a first metal layer 30 along the sidewall surfaces and the bottom surface of each of the trenches 22 and over a topmost surface of the second dielectric material layer 20. The first metal layer 30 may include a conductive metal such as, for example, Ti, TiN, Ta, TaN or Cu. The first metal layer 30 can be formed utilizing a deposition process including, for example, CVD, PECVD, PVD or ALD. The thickness of the first metal layer 30 can be from 1 nm to 25 nm, although lesser and greater thicknesses can also be employed.

Figure 5:
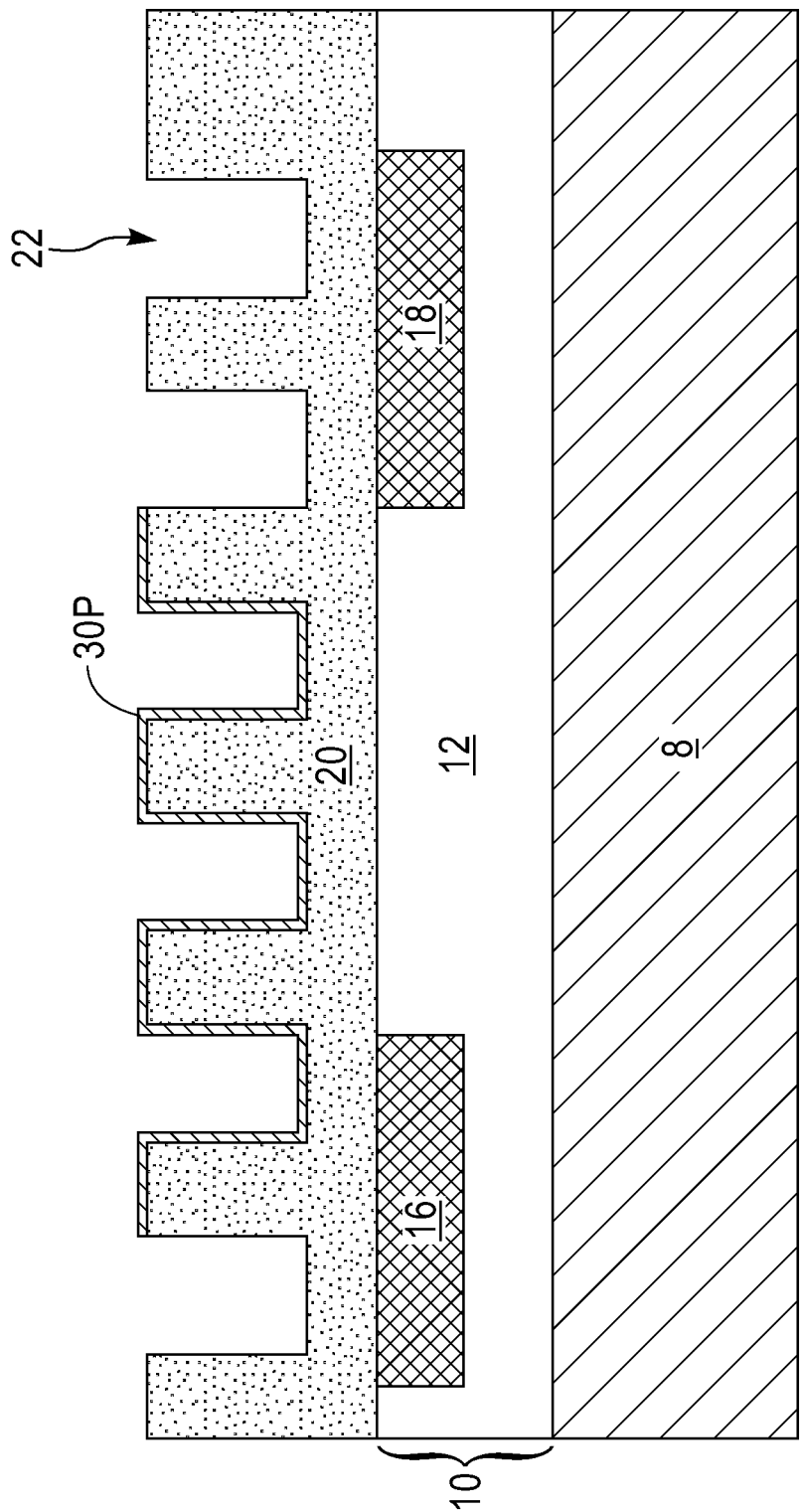
FIG. 5 is a cross sectional view of the exemplary semiconductor structure of FIG. 4 after patterning the first metal layer to provide a first metal portion.

Referring now to FIG. 5, there is illustrated the exemplary semiconductor structure of FIG. 4 after patterning the first metal layer 30 to remove the first metal layer 30 from unwanted areas. In one embodiment and as shown, the first metal layer 30 is completely removed from the area where the second lower interconnect structure 18 is located, but is only partially removed from the area where the first lower interconnect structure 16 is located. The remaining portion of the first metal layer 30 is herein referred to as a first metal portion 30P. As is shown, the first metal portion 30P overlies the first lower interconnect structure 16, but not the second lower interconnect structure 18.

The patterning of the first metal layer 30 can be performed by applying a photoresist layer (not shown) over the first metal layer 30, and then lithographically patterning the photoresist layer. The pattern in the photoresist layer is transferred through the first metal layer 30 by an anisotropic etch. The anisotropic etch can be a dry etch such as, for example, RIE or a wet etch that removes the conductive metal of the first metal layer 30 selective to the dielectric material of the second dielectric material layer 20. After patterning, the remaining portion of the photoresist layer can be subsequently removed, for example, by ashing.

Figure 6:
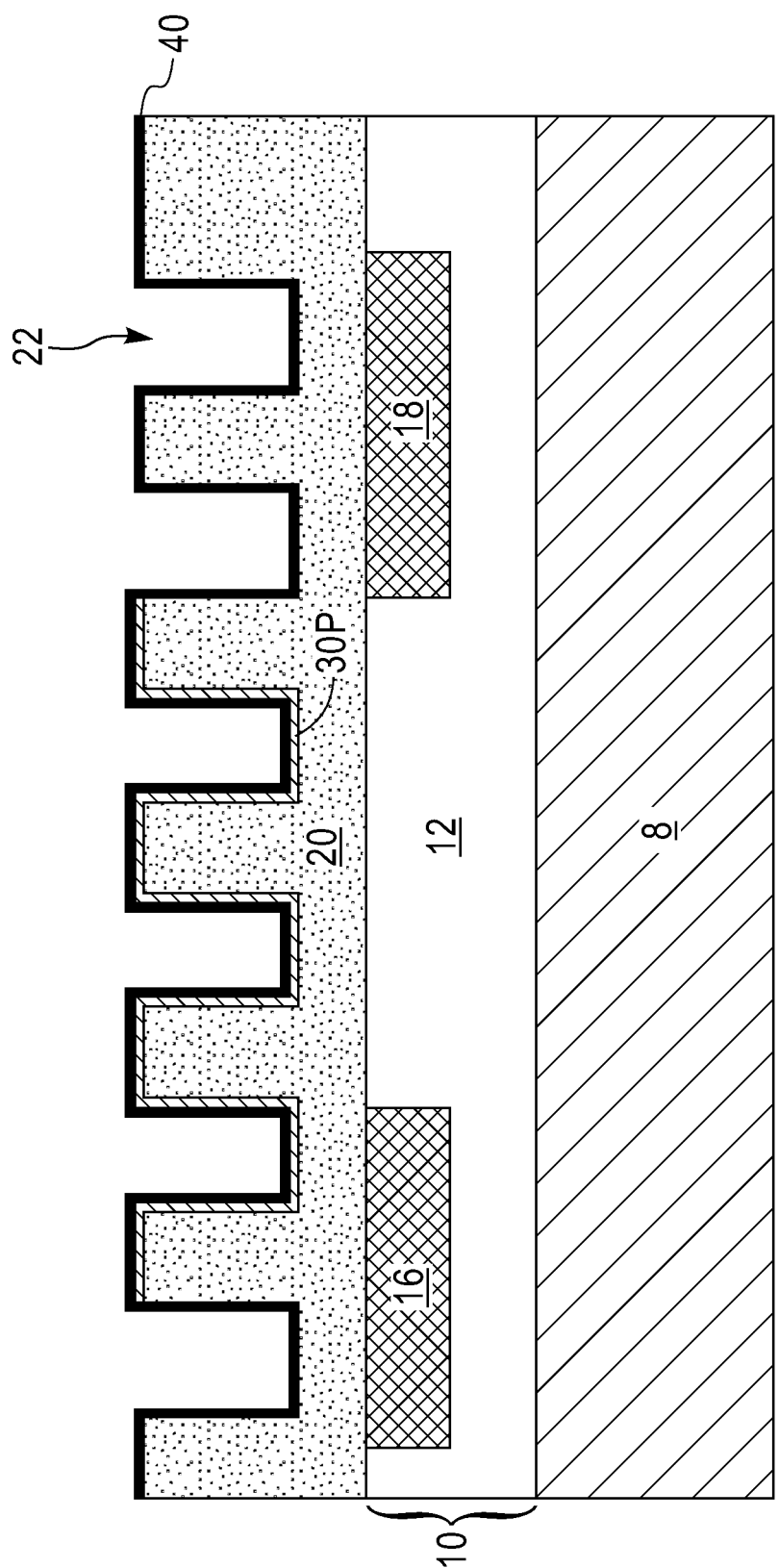
FIG. 6 is a cross sectional view of the exemplary semiconductor structure of FIG. 5 after conformally depositing a first capacitor dielectric layer on the first metal portion and on exposed surfaces of each of the trenches.

Referring now to FIG. 6, there is illustrated the exemplary semiconductor structure of FIG. 5 after conformally depositing a first capacitor dielectric layer 40 on the first metal portion 30P and on exposed surfaces of each of the trenches 22. In one embodiment, the first capacitor dielectric layer 40 may include silicon dioxide or silicon nitride. In another embodiment, the first capacitor dielectric layer 40 may include a high-k material having a dielectric constant greater than silicon dioxide. Exemplary capacitor dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof and an alloy thereof. Each value of x is independently from 0.5 to 3 and each value of y is independently from 0 to 2. The first capacitor dielectric layer 40 can be formed by any deposition process including, for example, CVD, PECVD, PVD, or ALD. The thickness of the first capacitor dielectric layer 40 can be from 1 nm to 10 nm, although lesser and greater thicknesses can also be employed.

Figure 7:
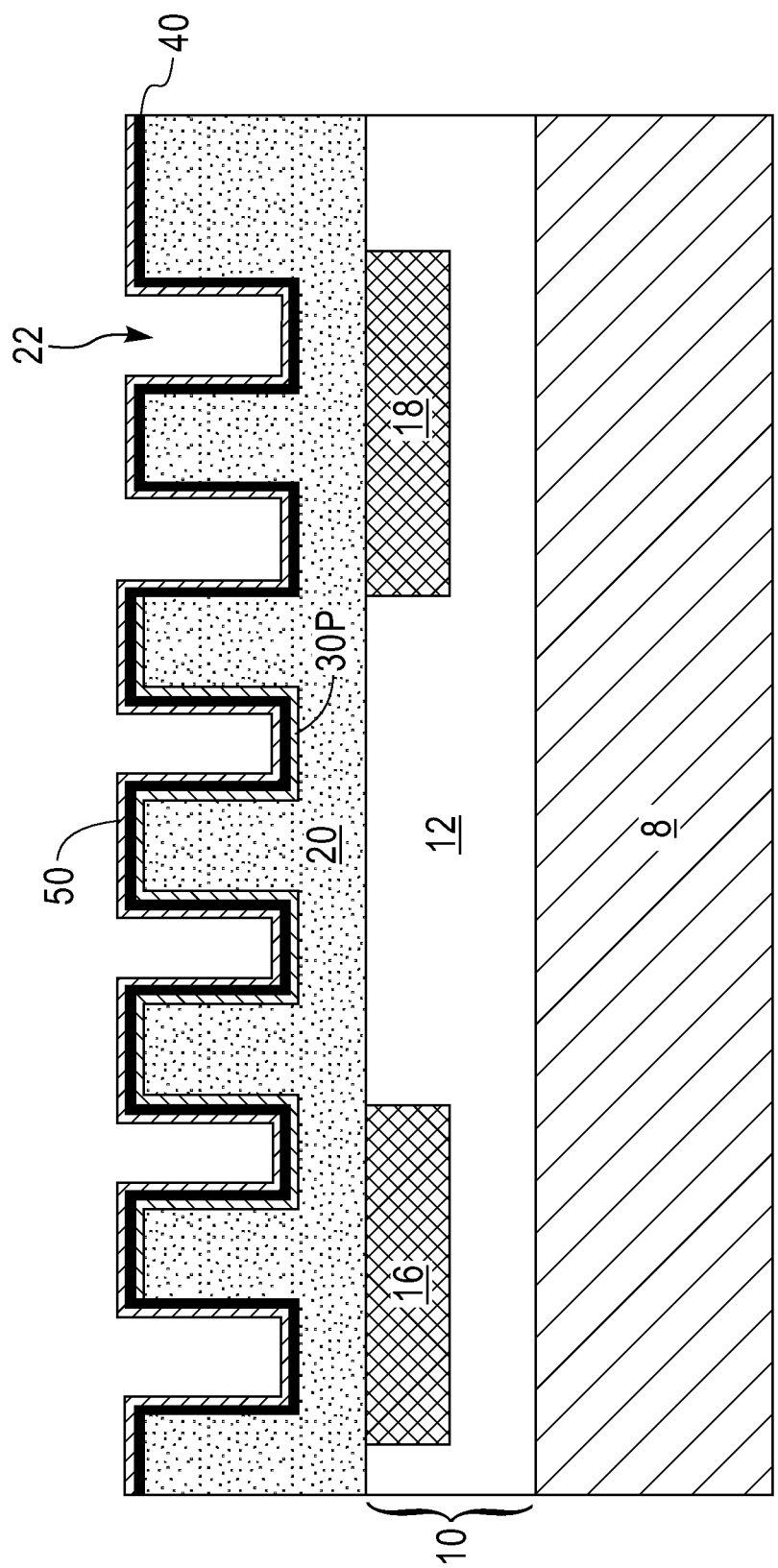
FIG. 7 is a cross sectional view of the exemplary semiconductor structure of FIG. 6 after conformally depositing a second metal layer on the first capacitor dielectric layer.

Referring now to FIG. 7, there is illustrated the exemplary semiconductor structure of FIG. 6 after conformally depositing a second metal layer 50 on the first capacitor dielectric layer 40. The second metal layer 50 may include a conductive metal the same as, or different from, the conductive metal that provides the first metal layer 30. For example, the second metal layer 50 may include Ti, TiN, Ta, TaN or Cu. The second metal layer 50 can be formed utilizing a deposition process including, for example, CVD, PECVD, PVD or ALD. The thickness of the second metal layer 50 can be from 1 nm to 25 nm, although lesser and greater thicknesses can also be employed.

Figure 8:
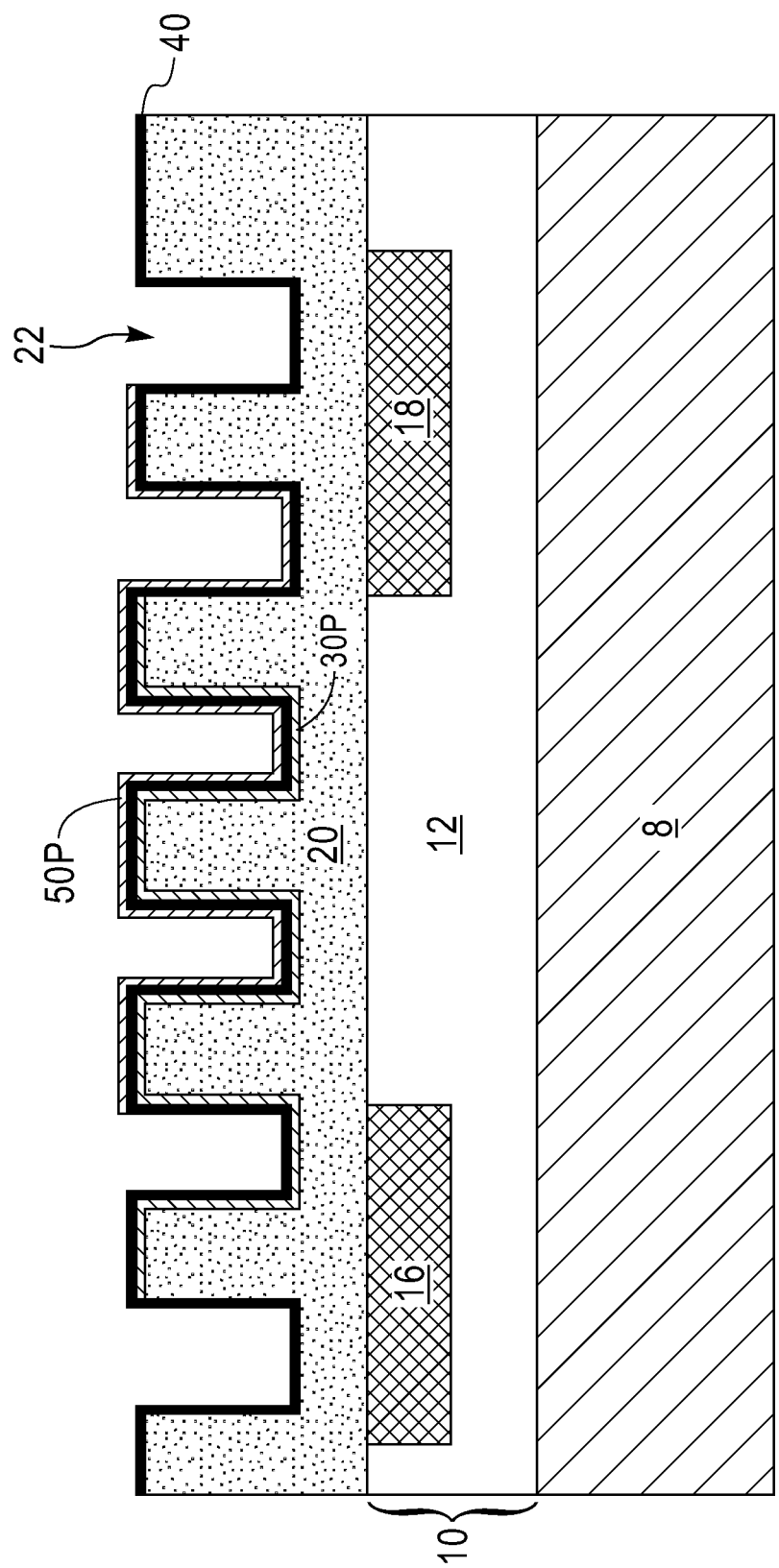
FIG. 8 is a cross sectional view of the exemplary semiconductor structure of FIG. 7 after patterning the second metal layer to provide a second metal portion.

Referring now to FIG. 8, there is illustrated the exemplary semiconductor structure of FIG. 7 after patterning the second metal layer 50 to remove the second metal layer 50 from unwanted areas. In one embodiment and as shown, the second metal layer 50 is completely removed from the area where the first lower interconnect structure 16 is located, but is only partially removed from the area where the second lower interconnect structure 18 is located. The remaining portion of the second metal layer 50 is herein referred to as a second metal portion 50P. As is shown, the second metal portion 50P overlies the second lower interconnect structure 18, but not the first lower interconnect structure 16. The second metal portion 50P is thus formed to overlap with a portion of the first metal portion 30P located between the first and second lower interconnect structures 16, 18.

The patterning of the second metal layer 50 can be performed by applying a photoresist layer (not shown) over the second metal layer 50, and then lithographically patterning the photoresist layer. The pattern in the photoresist layer is transferred through the second metal layer 50 by an anisotropic etch. The anisotropic etch can be a dry etch such as, for example, RIE or a wet etch that removes the conductive metal of the second metal layer 50 selective to the dielectric material of the first capacitor dielectric layer 40. After patterning, the remaining portion of the photoresist layer can be subsequently removed, for example, by ashing.

Figure 9:
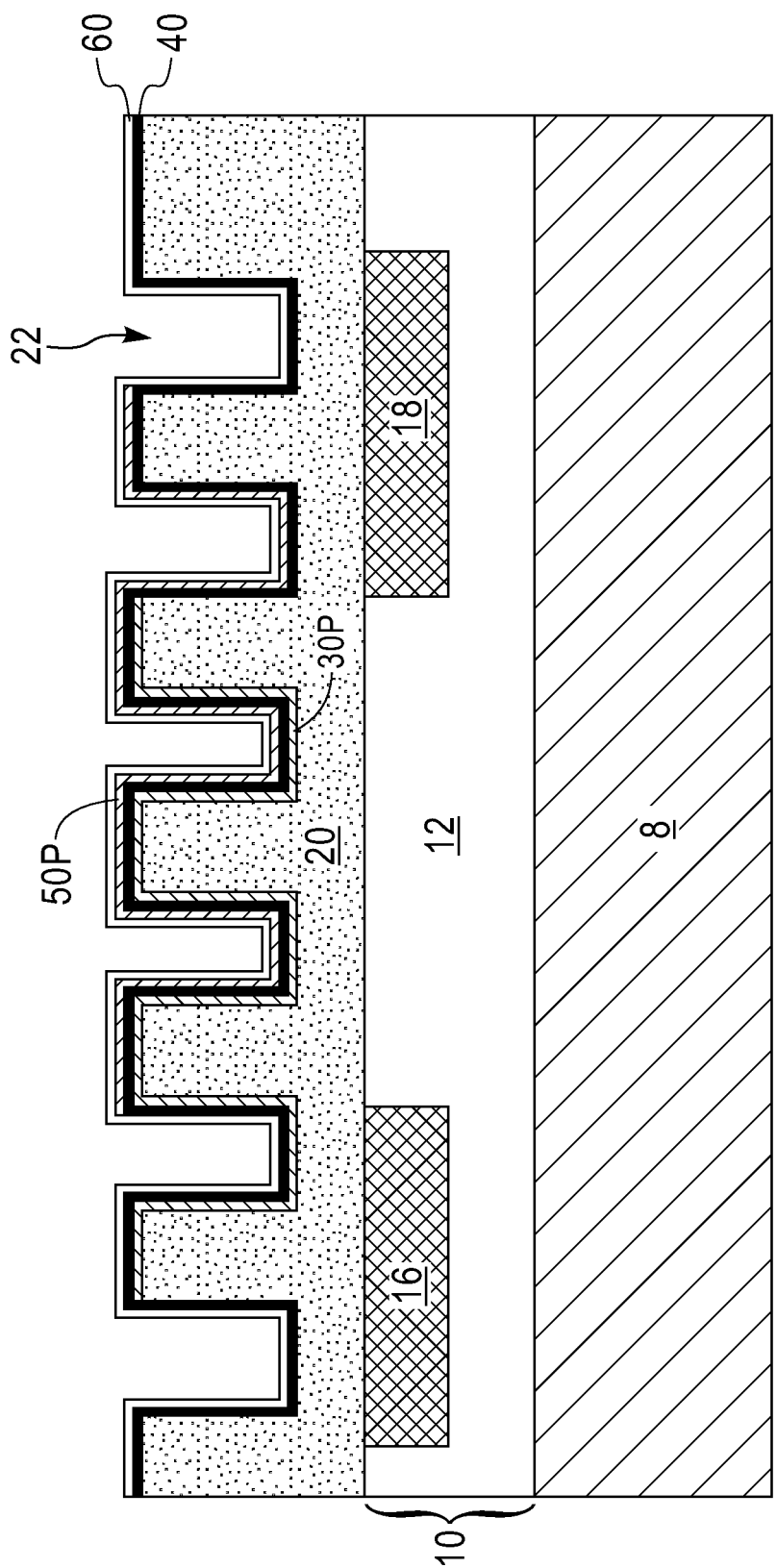
FIG. 9 is a cross sectional view of the exemplary semiconductor structure of FIG. 8 after conformally depositing a second capacitor dielectric layer on the second metal portion and on exposed portions of the first capacitor dielectric layer.

Referring now to FIG. 9, there is illustrated the exemplary semiconductor structure of FIG. 8 after conformally depositing a second capacitor dielectric layer 60 on the second metal portion 50P and on exposed portions of the first capacitor dielectric layer 40. The second capacitor dielectric layer 60 may include a dielectric material the same as, or different from, the dielectric material that provides the first capacitor dielectric layer 40. For example, the second capacitor dielectric layer 60 may include silicon dioxide, silicon nitride or a high-k dielectric material such as $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof or an alloy thereof. Each value of x is independently from 0.5 to 3 and each value of y is independently from 0 to 2. The second capacitor dielectric layer 60 can be formed by any deposition process including, for example, CVD, PECVD, PVD or ALD. The thickness of the second capacitor dielectric layer 60 can be from 1 nm to 10 nm, although lesser and greater thicknesses can also be employed.

Figure 10:
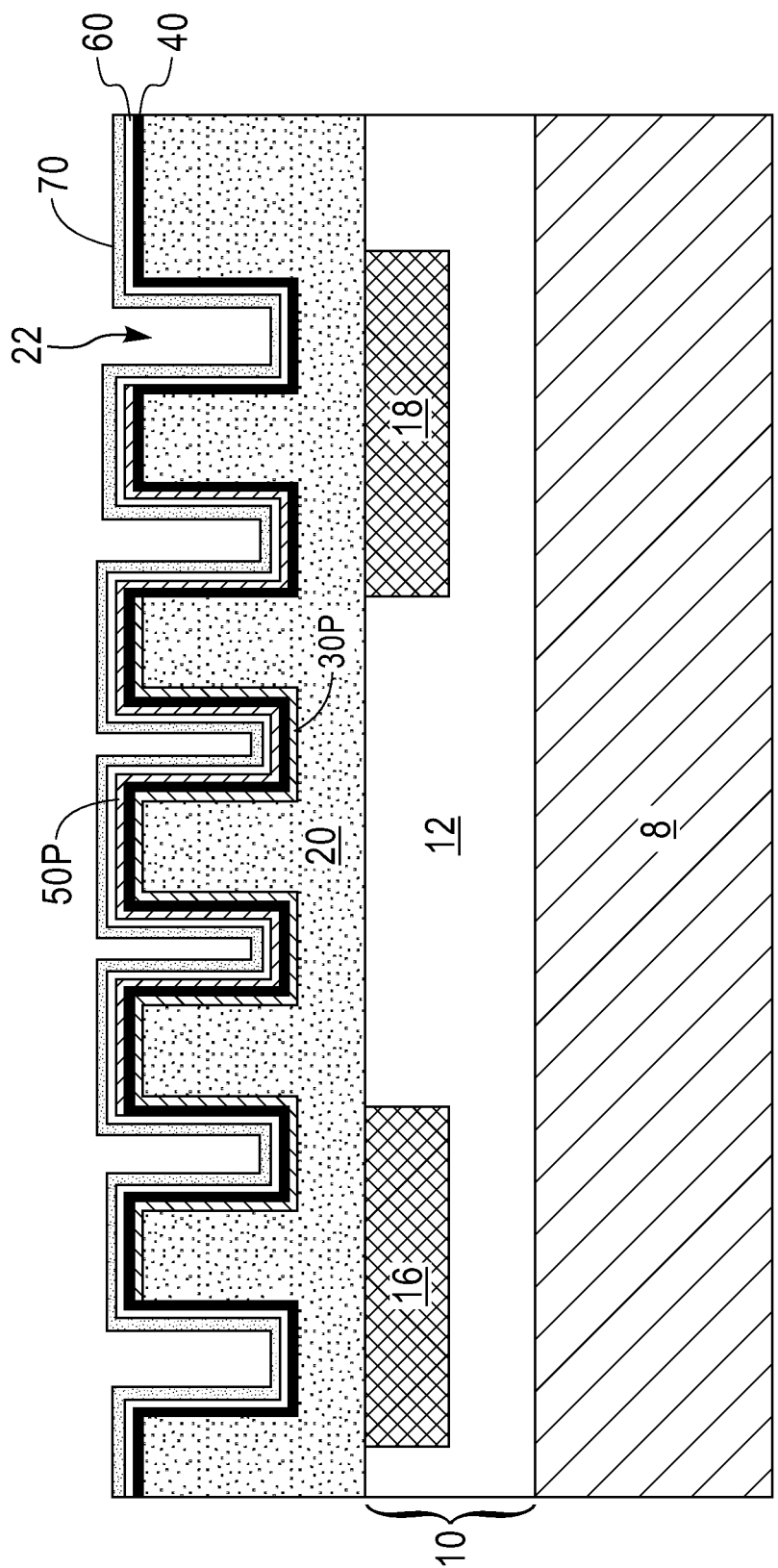
FIG. 10 is a cross sectional view of the exemplary semiconductor structure of FIG. 9 after conformally depositing a third metal layer on the second capacitor dielectric layer.

Referring now to FIG. 10, there is illustrated the exemplary semiconductor structure of FIG. 9 after conformally depositing a third metal layer 70 on the second capacitor dielectric layer 60. The third metal layer 70 may include a conductive metal the same as, or different from, the conductive meal that provides the second metal layer 50. For example, the third metal layer 70 may include Ti, TiN, Ta, TaN or Cu. The third metal layer 70 can be formed utilizing a deposition process including, for example, CVD, PECVD, PVD or ALD. The thickness of the third metal layer 70 can be from 1 nm to 25 nm, although lesser and greater thicknesses can also be employed.

Figure 11:
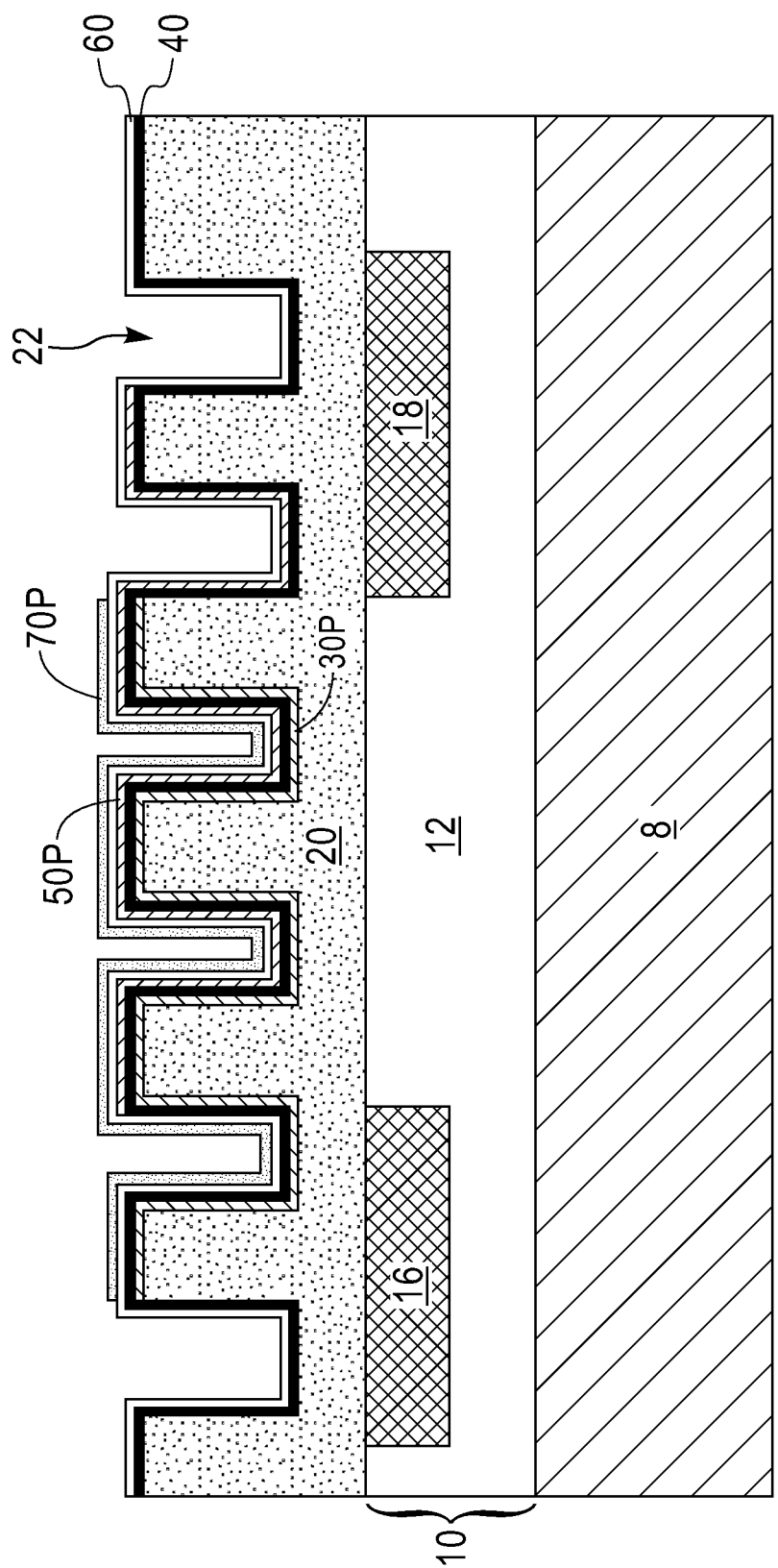
FIG. 11 is a cross sectional view of the exemplary semiconductor structure of FIG. 10 after patterning the third metal layer to provide a third metal portion.

Referring now to FIG. 11, there is illustrated the exemplary semiconductor structure of FIG. 10 after patterning the third metal layer 70 to remove the third metal layer 70 from unwanted areas. In one embodiment and as shown, the third metal layer 70 is completely removed from the area where the second lower interconnect structure 18 is located, but is only partially removed from the area where the first lower interconnect structure 16 is located. The remaining portion of the third metal layer 70 is herein referred to as a third metal portion 70P. As is shown, the third metal portion 70P overlies the first lower interconnect structure 16, but not the second lower interconnect structure 18. The third metal portion 50P is thus formed to overlap with the entire first metal portion 30P, but only overlap with a portion of the second metal portion 50P located between the first and second lower interconnect structures 16, 18.

The patterning of the third metal layer 70 can be performed by applying a photoresist layer (not shown) over the third metal layer 70, and then lithographically patterning the photoresist layer. The pattern in the photoresist layer is transferred through the third metal layer 70 by an anisotropic etch. The anisotropic etch can be a dry etch such as, for example, RIE or a wet etch that removes the conductive metal of the third metal layer 70 selective to the dielectric material of the second capacitor dielectric layer 60. After patterning, the remaining portion of the photoresist layer can be subsequently removed, for example, by ashing.

In some embodiments of the present application, the steps in the process described above relating to forming the second capacitor dielectric layer 60 and the third metal layer 70 and patterning the third metal layer 70 can be omitted such that a two-electrode MIM capacitor, rather than a three-electrode MIM capacitor is formed in later processes. In other embodiments, more dielectric and metal layers can be deposited and patterned to form more than three-electrode MIM capacitors.

Figure 12:
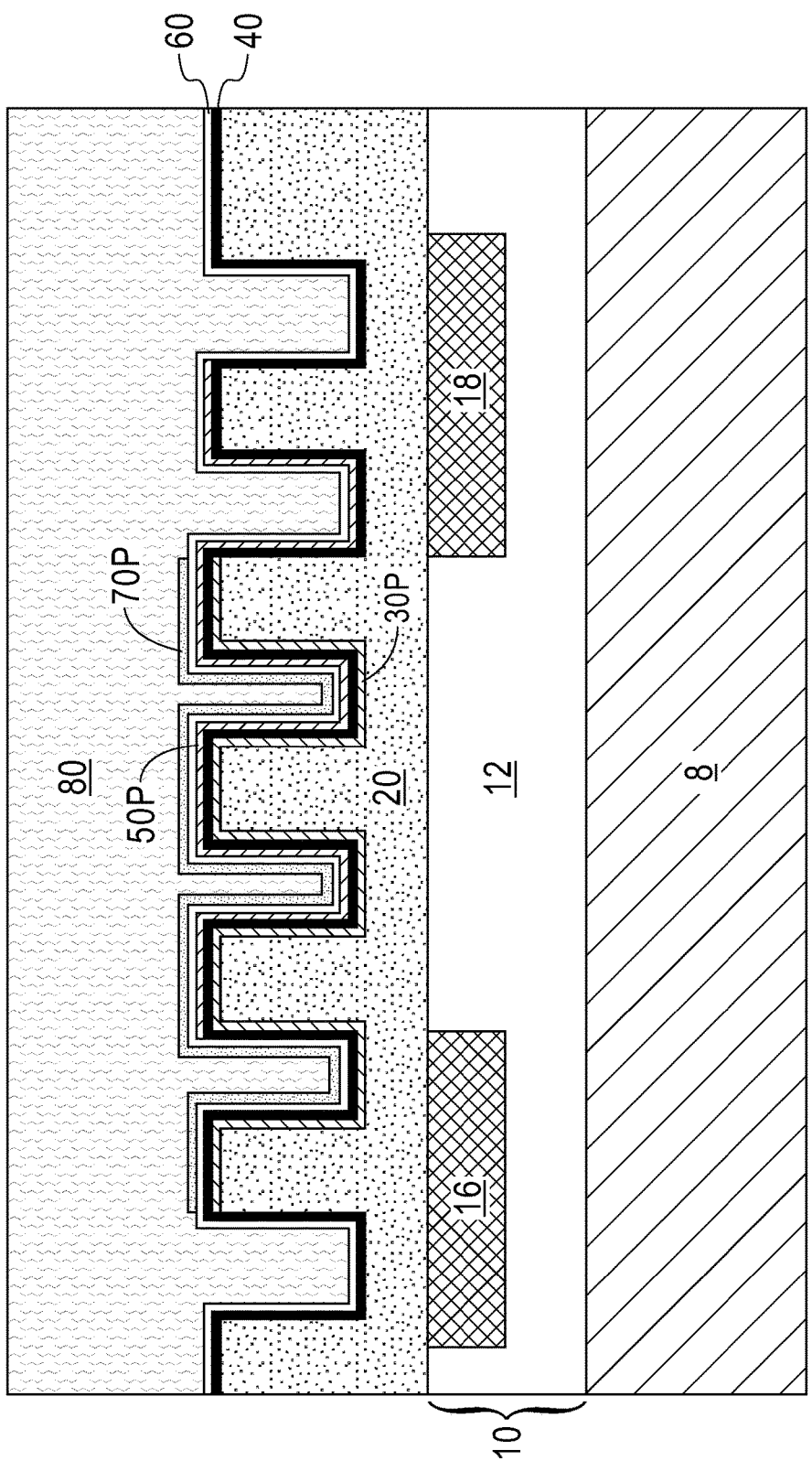
FIG. 12 is a cross sectional view of the exemplary semiconductor structure of FIG. 11 after forming a third dielectric material layer over the third metal portion and exposed portions of the second capacitor dielectric layer.

Referring now to FIG. 12, there is illustrated the exemplary semiconductor structure of FIG. 11 after forming a third dielectric material layer 80 over the third metal portion 70P and exposed portions of the second capacitor dielectric layer 60. The third dielectric material layer 80 completely fills each of the trenches 22. The third dielectric material layer 80 may include a dielectric material the same as, or different from, the dielectric material that provides the second dielectric material layer 40. For example, the third dielectric material layer 80 may include organosilicates, silsequioxanes, USG, FSG, SiCOH or BPSG. The third dielectric material layer 80 may be formed by CVD, PVD or spin coating. The third dielectric material layer 80 can be deposited to a thickness such that a topmost surface of the third dielectric material 80 is located above the topmost surface of the third metal portion 70. In one embodiment, the thickness of the third dielectric material layer 80 may be from 100 nm to 1,000 nm, although lesser and greater thicknesses can also be employed. In some embodiments of the present application, following the deposition of the third dielectric material layer 80, the third dielectric material layer 80 can be subsequently planarized, for example, by CMP.

Figure 13:
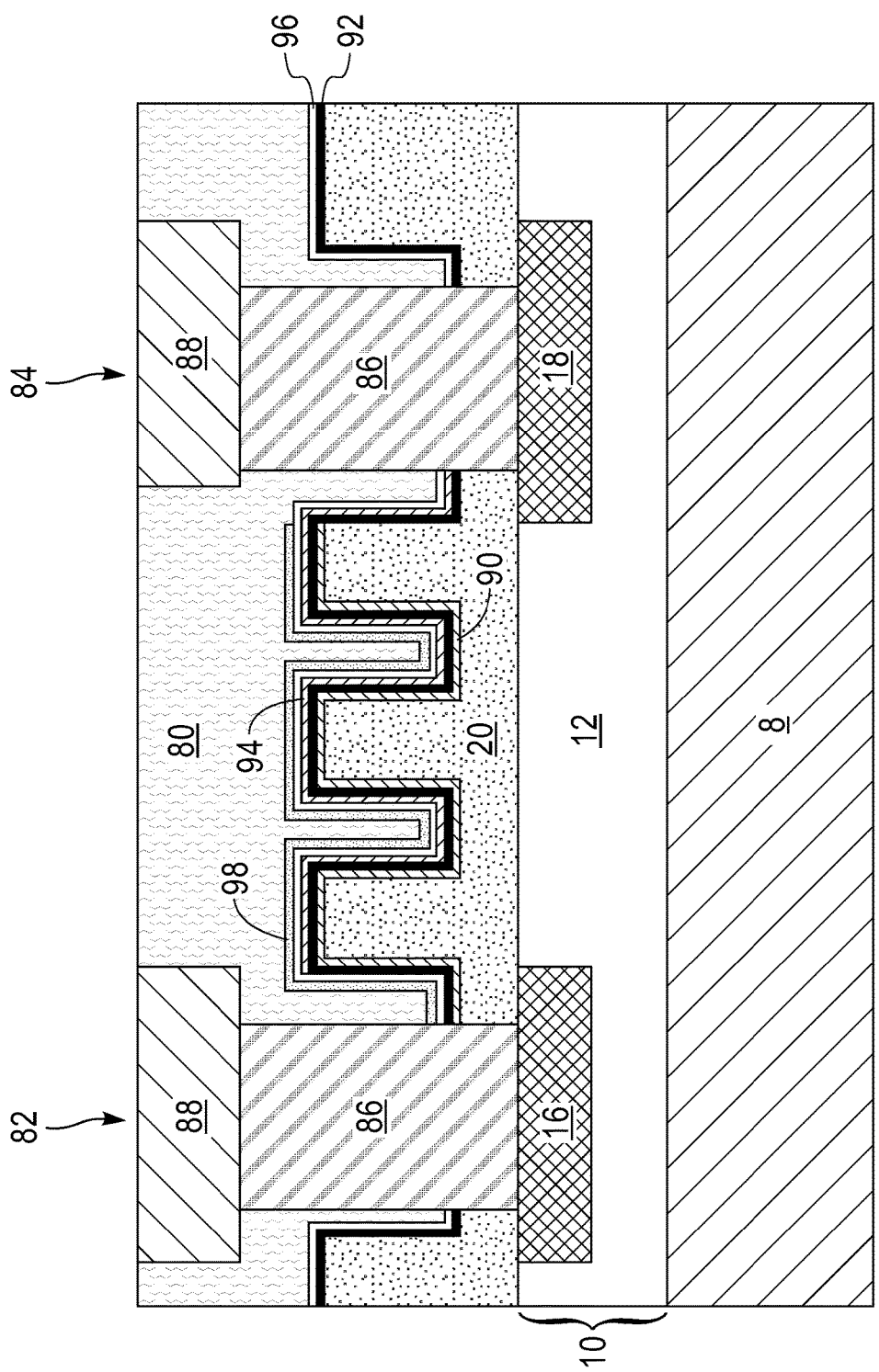
FIG. 13 is a cross sectional view of the exemplary semiconductor structure of FIG. 12 after forming a first upper interconnect structure and a second upper interconnect structure.

Referring now to FIG. 13, there is illustrated the exemplary semiconductor structure of FIG. 12 after forming a first upper interconnect structure 82 that provides electrical connection to the first lower interconnect structure 16 and a second upper interconnect structure 84 that provides electrical connection to the second lower interconnect structure 18. The first upper interconnect structure 82 extends through the third dielectric material layer 80, the third metal portion 70P, if present, the second capacitor dielectric layer 60, if present, the first capacitor dielectric layer 40, the first metal portion 30P and the second dielectric material layer 20, contacting the first lower interconnect structure 16. The second upper interconnect structure 84 extends through the second capacitor dielectric layer 60, the second metal portion 50P, the first capacitor dielectric layer 40 and the second dielectric material layer 20, contacting the second lower interconnect structure 18.

Each of the first and second upper interconnect structures 82, 84 includes a conductive via structure 86 and a conductive line structure 88. Each conductive line structure 88 has a topmost surface coplanar with the topmost surface of the third dielectric material layer 80. Each of the first and second upper interconnect structures 82, 84 may be composed of a conductive material such as, for example, A W, Cu, Al, Co, Ru, Mo, Os, Jr, Rh or an alloy thereof. The first and second upper interconnect structures 82, 84 can be formed by a dual damascene process as known in the art. For example, a dual damascene integrated opening including a line opening and a via opening can be formed by an anisotropic etch to expose each of the first lower interconnect structure 16 and the second lower interconnect structure 18. The dual damascene integrated openings are subsequently filled with a conductive material to provide the first upper interconnect structure 82 and the second upper interconnect structure 84. In some embodiments of the present application, a contact liner (not shown) may be formed along surfaces of each dual damascene integrated opening to surround the conductive via structure 86 and a conductive line structure 88. In one embodiment, each contact liner may include TiN.

A grated MIM capacitor is thus formed. The grated MIM capacitor includes a bottom electrode 90 which is a portion of the first metal portion 30P remaining between the first and second upper interconnect structures 82, 84, a first capacitor dielectric 92 which is a portion of the first capacitor dielectric layer 40 remaining between the first and second upper interconnect structures 82, 84, a middle electrode 94 which is a portion of the second metal portion 50P remaining between the first and second upper interconnect structures 82, 84, a second capacitor dielectric 96 which is a portion of the second capacitor dielectric layer 60 remaining between the first and second upper interconnect structures 82, 84, and a top electrode 98 which is a portion of the third metal portion 70P remaining between the first and second upper interconnect structures 82, 84. The first capacitor dielectric 92 is interposed between the bottom electrode 90 and the middle electrode 94, thus the first capacitor dielectric 92 electrically insulates the bottom electrode 90 and the middle electrode 94. The second capacitor dielectric 96 is interposed between the middle electrode 94 and the top electrode 98, thus the second capacitor dielectric 96 electrically insulates the middle electrode 94 and the top electrode 98. The first upper interconnect structure 82 laterally contacts the bottom electrode 90 and the top electrode 98, while the second upper interconnect structure 84 laterally contacts the middle electrode 94.

In instances where the second capacitor dielectric layer 60 and the third metal layer 70 are omitted, a two-electrode grated MIM capacitor including a bottom electrode 90, a first capacitor dielectric 92 and a middle electrode 94 is formed. The middle electrode 94 constitutes the top electrode for the two-electrode grated MIM capacitor. In this case, the first upper interconnect structure 82 laterally contacts only the bottom electrode 90.

In the present application, by forming various components of a MIM capacitor (e.g., bottom electrode 90, first capacitor dielectric 92, middle electrode 94, second capacitor dielectric 96 and top electrode 96) along surfaces of trenches 22, the surface area of the resulting MIM capacitor is increased. As a result, the capacitance of the MIM capacitor is increased without increasing the area occupied by the MIM capacitor.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
    a first lower interconnect structure embedded in a portion of a first dielectric material layer and a second lower interconnect structure embedded in another portion of the first dielectric material layer;
    a second dielectric material layer located over the first dielectric material layer;
    a metal-insulator-metal (MIM) capacitor located along sidewall surfaces and a bottom surface of each trench of a plurality of trenches present in an upper portion of the second dielectric material layer and on a topmost surface of the second dielectric material layer;
    a third dielectric material layer located over the MIM capacitor and the second dielectric material layer;
    a first upper interconnect structure extending through the third dielectric material layer and the second dielectric material layer to vertically contact the first lower interconnect structure, wherein the first upper interconnect structure laterally contacts a first end of the MIM capacitor; and
    a second upper interconnect structure extending through the third dielectric material layer and the second dielectric material layer to vertically contact the second lower interconnect structure, wherein the second upper interconnect structure laterally contacts a second end of the MIM capacitor opposite the first end.

2. The semiconductor structure of claim 1, wherein the MIM capacitor comprises a bottom electrode located along the sidewall surfaces and the bottom surface of each trench of the plurality of trenches and on the topmost surfaces of the portions of the second dielectric material layer defining the plurality of trenches, a first capacitor electric located on the bottom electrode, a middle electrode located on the first capacitor electric, a second capacitor electric located on the middle electrode and a top electrode located on the second capacitor electrode.

3. The semiconductor structure of claim 2, wherein the first upper interconnect structure laterally contacts an end wall of the bottom electrode and an end wall of the top electrode, and the second upper interconnect structure laterally contacts an end wall of the middle electrode.

4. The semiconductor structure of claim 2, wherein a portion of the middle electrode overlaps a portion of the bottom electrode and a portion of the top electrode.

5. The semiconductor structure of claim 2, wherein the first upper interconnect structure laterally contacts an end wall of the first capacitor dielectric and an end wall the second upper capacitor dielectric, and the second interconnect structure laterally contacts another end wall of the first capacitor dielectric and another end wall of the second capacitor dielectric.

6. The semiconductor structure of claim 2, wherein each of the bottom electrode, the middle electrode and the top electrode comprises Ti, TiN, Ta, TaN, or Cu.

7. The semiconductor structure of claim 2, wherein each of the first capacitor dielectric and the second capacitor dielectric comprises silicon dioxide, silicon nitride or a high-k dielectric material.

8. The semiconductor structure of claim 1, wherein each of the first upper interconnect structure and the second upper interconnect structure comprises a conductive via structure and a conductive line structure atop the conductive via structure, wherein the conductive via structure in the first upper interconnect structure laterally contacts the first end of the MIM capacitor, and the conductive via structure in the second upper interconnect structure laterally contacts the second end of the MIM capacitor.

9. The semiconductor structure of claim 8, wherein the conductive line structure in each of the first upper interconnect structure and the second upper interconnect structure has a topmost surface coplanar with a topmost surface of the third dielectric material layer.

10. The semiconductor structure of claim 1, wherein each of the first lower interconnect structure and the second lower interconnect structure has a topmost surface coplanar with a topmost surface of the first dielectric material layer.

* * * * *